United States Patent
Corisis

[19]

[11] Patent Number: 5,907,769
[45] Date of Patent: May 25, 1999

[54] LEADS UNDER CHIP IN CONVENTIONAL IC PACKAGE

[75] Inventor: David J. Corisis, Meridian, Id.

[73] Assignee: Micron Technology, Inc., Boise, Id.

[21] Appl. No.: 08/774,609

[22] Filed: Dec. 30, 1996

[51] Int. Cl.⁶ .................................................. H01L 21/60
[52] U.S. Cl. ............................................................. 438/123
[58] Field of Search .......................... 438/123, FOR 377, 438/FOR 380

[56] References Cited

U.S. PATENT DOCUMENTS

| | | |
|---|---|---|
| 3,444,440 | 5/1969 | Bell et al. . |
| 3,708,730 | 1/1973 | Schlerz et al. . |
| 4,048,438 | 9/1977 | Zimmerman . |
| 4,246,595 | 1/1981 | Noyori et al. . |
| 4,447,857 | 5/1984 | Marks et al. . |
| 4,595,945 | 6/1986 | Graver . |
| 4,612,564 | 9/1986 | Moyer . |
| 4,827,328 | 5/1989 | Ozawa et al. . |
| 4,934,820 | 6/1990 | Takashashi et al. . |
| 4,937,656 | 6/1990 | Kohara . |
| 4,943,843 | 7/1990 | Okinaga et al. . |
| 5,399,898 | 3/1995 | Rostoker . |
| 5,445,311 | 8/1995 | Trask et al. . |
| 5,497,030 | 3/1996 | Takeuchi . |
| 5,497,031 | 3/1996 | Kozono . |
| 5,502,278 | 3/1996 | Mabboux et al. . |
| 5,504,370 | 4/1996 | Lin et al. . |
| 5,539,251 | 7/1996 | Iverson et al. . |
| 5,541,446 | 7/1996 | Kierse . |
| 5,550,402 | 8/1996 | Nicklaus . |
| 5,554,886 | 9/1996 | Song . |
| 5,557,143 | 9/1996 | Seiji . |
| 5,663,594 | 9/1997 | Kimura . |
| 5,763,829 | 6/1998 | Tomita et al. . |
| 5,776,799 | 7/1998 | Song et al. . |

FOREIGN PATENT DOCUMENTS

| | | |
|---|---|---|
| 2-110961 | 4/1990 | Japan . |
| 3-6850 | 1/1991 | Japan . |
| 3-195052 | 8/1991 | Japan . |

*Primary Examiner*—David Graybill
*Attorney, Agent, or Firm*—Trask, Britt & Rossa

[57] ABSTRACT

A process for manufacturing a semiconductor device assembly including a semiconductor device having a plurality of bond pads on the active surface thereof and a lead frame having a portion of the plurality lead fingers of the lead frame located below the semiconductor device in a substantially horizontal plane and another portion of the plurality of lead fingers of the lead frame located substantially in the same horizontal plane as the active surface of the semiconductor device. Both plurality of lead finger of the lead frame having their ends being located substantially adjacent the peripheral sides of the semiconductor device, rather than at the ends thereof.

13 Claims, 4 Drawing Sheets

LEADS UNDER CHIP IN CONVENTIONAL IC PACKAGE

BACKGROUND OF THE INVENTION

1. Field of the Invention

The present invention is related to a semiconductor device assembly including a semiconductor device having a plurality of bond pads on the active surface thereof and a lead frame having a first portion of the plurality lead fingers of the lead frame located below the inactive surface of the semiconductor device in a substantially horizontal plane and another portion of the plurality of lead fingers of the lead frame located substantially in the same horizontal plane as the active surface of the semiconductor device. Both plurality of lead fingers of the lead frame having their ends being located substantially adjacent the peripheral sides of the semiconductor device, rather than at the ends thereof.

2. State of the Art

High performance, low cost, increased miniaturization of components, and greater packaging density of integrated circuits have been and are goals in the electronics industry. Greater integrated circuit package density, for given level of component and internal conductor density, is primarily limited by the space available for semiconductor device mounting and packaging. For lead frame mounted semiconductor devices, this limitation is a result of the conventional lead frame design, such conventional lead frame design inherently limits potential single-die package density because the die-attach paddle of the lead frame must be as large or larger than the semiconductor device secured thereto. The larger the semiconductor device, the less space (relative to size of the semiconductor device) that remains around the periphery of the die-attach paddle for bond pads for attendant wire bonding. Furthermore, the inner ends of the lead fingers of a lead frame provide anchor points for the lead fingers when the lead fingers and the die are encapsulated in plastic. These anchor points may be emphasized later as flanges or bends or kinks in the lead. Therefore, as the die size is increased in relation to the package size in ever decreasing size semiconductor packages, there is a corresponding reduction in the space along the sides of the package for the encapsulating plastic which joins the top and bottom portions of the molded plastic body at the mold part line and anchors to the leads. As the leads are subjected to the normal stresses of forming and assembly operations, the encapsulating plastic may crack, which may destroy the package seal and substantially increase the probability of premature semiconductor device failure.

One method of increasing integrated circuit density is to stack semiconductor dice vertically. U.S. Pat. No. 5,012,323 to Farnworth illustrates combining a pair of semiconductor devices mounted on opposing sides of a lead frame. An upper semiconductor device is back-bonded to the upper surface of the leads of the lead frame by a first adhesively coated, insulated film layer. The lower semiconductor device is face-bonded to the lower lead frame die-bonding region via a second, adhesively coated, insulative, film layer. The wire-bonding pads on both upper die and lower semiconductor devices are interconnected with the ends of their associated lead extensions with gold or aluminum wires. The lower die needs to be sightly larger than the upper die in order that the lower die bonding pads are accessible from above through an aperture in the lead frame such that gold wire connections can be made to the lead extensions. However, this arrangement has a major disadvantage from a production standpoint, since the different size semiconductor devices require that different separate equipment produce the different dice or that the same equipment be switched over in different production runs to produce the different semiconductor devices. Moveover, the lead frame design employed by Farnworth employs long conductor runs between the die and the exterior of the package. Also, the lead frame configuration is specialized and rather complex.

U.S. Pat. No. 5,291,061 to Ball illustrates a multiple stacked semiconductor device that contains up to four such devices which does not exceed the height of current single semiconductor device packages. The low profile of the semiconductor device is achieved by close-tolerance stacking which is made possible by a low-loop-profile wirebonding operation and thin adhesive layers between the stacked semiconductor devices. However, Ball secures all of the semiconductor devices to the same side of the lead frame, thereby increasing wire length. Moreover, Ball employs a die paddle to support the semiconductor device stack.

U.S. Pat. No. 4,862,245 to Pashby illustrates "leads-over-chip" (LOC) configuration, wherein the inner lead ends of a standard dual-in-line package (DIP) lead frame configuration extend over and are secured to the active (upper) of the semiconductor device through a dielectric layer. The bond wire length is shortened by placing the inner lead ends in closer proximity to a central row of die bond pads, and the lead extensions purportedly enhance heat transfer from the semiconductor device. However, the Pashby LOC configuration, as disclosed, relates to mounting and bonding a single semiconductor device with the inner lead ends of the lead fingers chive surface of the semiconductor device.

U.S. Pat. No. 4,943,843 illustrates a semiconductor device having improved packaging adhesion of the lead fingers within the packaging resin by spreading leads on or near the non-circuit forming face of the semiconductor device thereby extending the lengths of the inner portions of the lead fingers on or under the semiconductor device. As illustrated in the '843 patent, the semiconductor device is of the type having bond pads located only on the ends thereof, not the peripheral sides of the semiconductor device or about the entire periphery of the semiconductor device.

U.S. Pat. No. 4,595,945 illustrates a lead frame to distribute power off a semiconductor device using a lead frame having the support paddle of the lead frame being split electrically to provide at least two conductor members that cross under the inactive surface of the semiconductor device. As illustrated, the semiconductor device is of the configuration type having bond pads located only on the ends thereof, not about the peripheral sides of the semiconductor chip or the entire entire periphery of the semiconductor device.

U.S. Pat. No. 5,554,886 illustrates a lead frame used to support a semiconductor device having a portion of the peripheral lead fingers of the lead frame extending along the peripheral sides of the semiconductor device and locally supporting the semiconductor chip therealong. However, no lead fingers are used which extend under the length of the inactive surface of the semiconductor chip to support the semiconductor device and are connected by wire bonding to the bond pads of the semiconductor device.

U.S. Pat. No. 5,557,143 illustrates a packaged semiconductor device assembly utilizing a plurality of leads. Such leads are arranged in an up and down staggered manner, an interval between ends of low stage leads in the package being narrower than a width of upper stage leads and ends of the lower stage leads in the package are positioned nearer to the semiconductor device pad than ends of the tipper stage leads. However, none of the leads extend below the semiconductor device which is solely supported by the die paddle (pad).

SUMMARY OF THE INVENTION

The present invention is related to a semiconductor device assembly including a semiconductor device having a plurality of bond pads on the active surface thereof and a lead frame having a first portion of the plurality lead fingers of the lead frame located below the inactive surface of the semiconductor device in a substantially horizontal plane and another portion of the plurality of lead fingers of the lead frame located substantially in the same horizontal plane as the active surface of the semiconductor device. Both plurality of lead fingers of the lead frame having their ends being located substantially adjacent the peripheral sides of the semiconductor device, rather than at the ends thereof.

The present invention will be better understood when the drawings are taken in conjunction with the description of the invention hereinafter.

DESCRIPTION OF THE INVENTION

Figure 1:
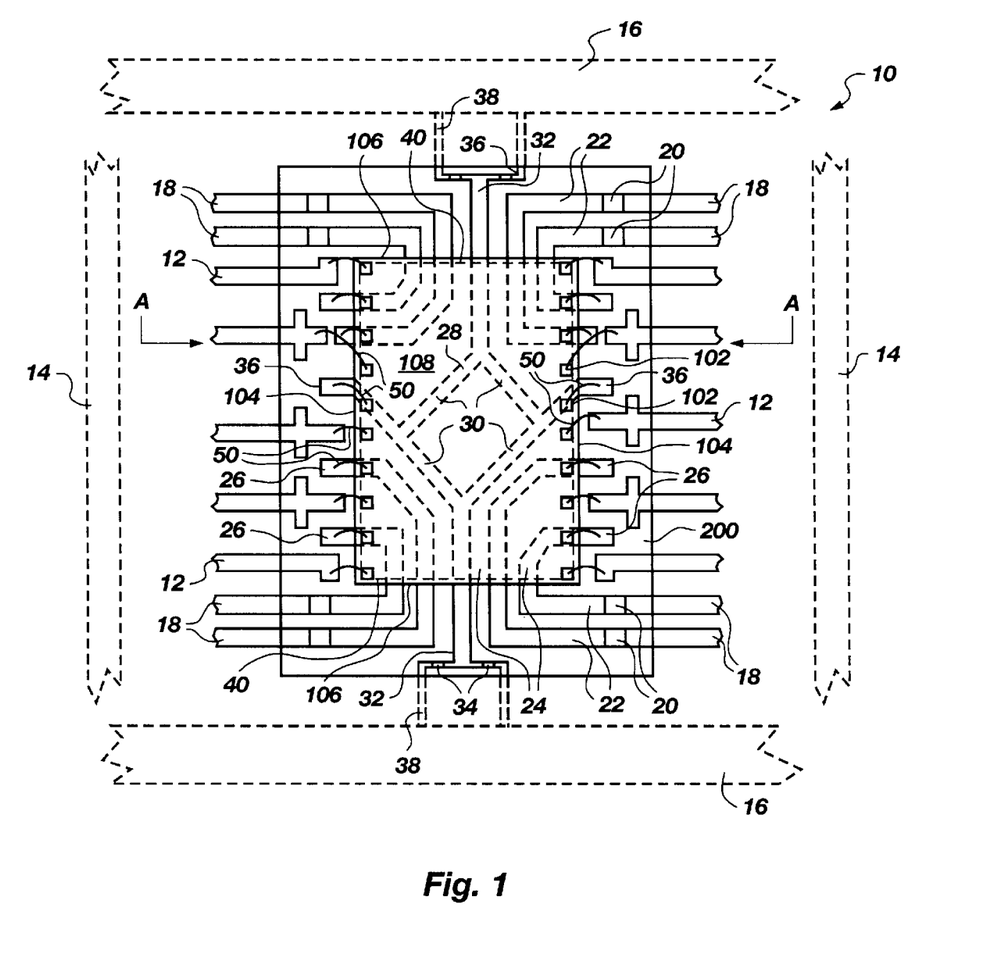
FIG. 1 is a top view of a portion of the first embodiment of the present invention of the semiconductor assembly including a semiconductor device and lead frame.

Referring to drawing FIG. 1, a semiconductor assembly of a first embodiment of the present invention including a portion of the lead frame 10 is shown in relation to a semiconductor device 100 in an encapsulated package 200.

As illustrated, the semiconductor chip 100 includes a plurality of bond pads 102 located on the longer peripheral sides 104 thereon, rather than on the ends 106 of the semiconductor device 100. The semiconductor device 100 may of any type, such as a memory device, a microprocessor, etc. The lead frame 10 of the present invention is illustrated having a first plurality of lead fingers 12 which at one time were connected to tie bars 14 before being separated therefrom during the packaging process of the semiconductor device 100. The first plurality of lead fingers 12 extend substantially inwardly in a substantially parallel manner with respect to adjacent individual lead fingers 12 from the tie bars 14 to terminate at ends 13 thereof which are located substantially adjacent the longer peripheral sides 104 of the semiconductor device 100 in substantially the same horizontal plane as the active surface 108 of the semiconductor device 100.

As further illustrated, the lead frame 10 of the present invention further includes a second plurality of lead fingers 18, each lead finger 18 extending substantially inwardly in a substantially parallel manner with respect to individual adjacent lead fingers 18 from the tie bars 14, are downset at portions 20 thereon to have portions 22 thereof lying a horizontal plane which is substantially slightly lower than the bottom inactive surface of the semiconductor device 100, the portions 22 of each lead finger 18 having a first portion which extends substantially parallel to the end 106 of the semiconductor device 100 and a second portion which extends substantially perpendicular to the end 106 of the semiconductor device 100 and extending thereto, and lead finger portions 24 which extend under the bottom inactive surface of the semiconductor device 100, which help support the semiconductor device 100, and terminate at ends 26 outside the semiconductor device 100 substantially adjacent a longer peripheral side 104 of the semiconductor device 100. Each portion 24 of a lead finger 18 having a first portion extending substantially parallel to a side 104 of the semiconductor device 100 and a second portion terminating in an end 26 extending substantially perpendicular to the side 104 of the semiconductor device 100 and a third transition portion which may contain one or more angled portions therein to transition the lead finger 18 from extending in a first direction from perpendicular to an end 106 of the semiconductor device 100 to perpendicular to a side 104 of the semiconductor device 100.

The lead frame 10 of the present invention further includes die paddle 28 formed by die paddle members 30 in any desired geometric shape, having an opening therein or as a unitary piece, which are, in turn, connected to die paddle supports 32, each of which contain downsets 34 therein so that the die paddle 28 is located in a horizontal plane below the semiconductor device 100. The die paddle supports 32 each further include ends 36 thereon which terminate outside the semiconductor device 100 substantially adjacent a longer peripheral side 104 of the semiconductor device 100. Outer portions 38 of the die paddle supports 32 extended to frame rails 16 of the lead frame 10 before being severed therefrom after packaging of the semiconductor device 100.

The first plurality of lead fingers 12, second plurality of lead fingers 18, and die paddle supports 32 have their ends 13, 26, and 36, respectively, connected to bond pads 102 of the semiconductor device 100 by means of wire bonds 50 formed during suitable wire bond processes well known in the art.

As illustrated, after the wire bonds 50 are made connecting the ends 13, 26, and 36 of the first plurality of lead fingers 12, second plurality of lead fingers 18, and die paddle supports 32, respectively, the semiconductor device 100 is encapsulated in suitable well known epoxy plastic material to form the package 200 in a well known standard die molding process.

As illustrated, a piece of suitable tape 40, such as Kapton tape, is adhesively secured, using any suitable thermosetting adhesive, to the portions 24 of the first plurality of lead fingers 18, the die paddle members 30, and die paddle supports 32. Preferably, a silver filled epoxy paste adhesive material is used to adhesively attach the semiconductor device 100 to the tape 40.

Figure 2:
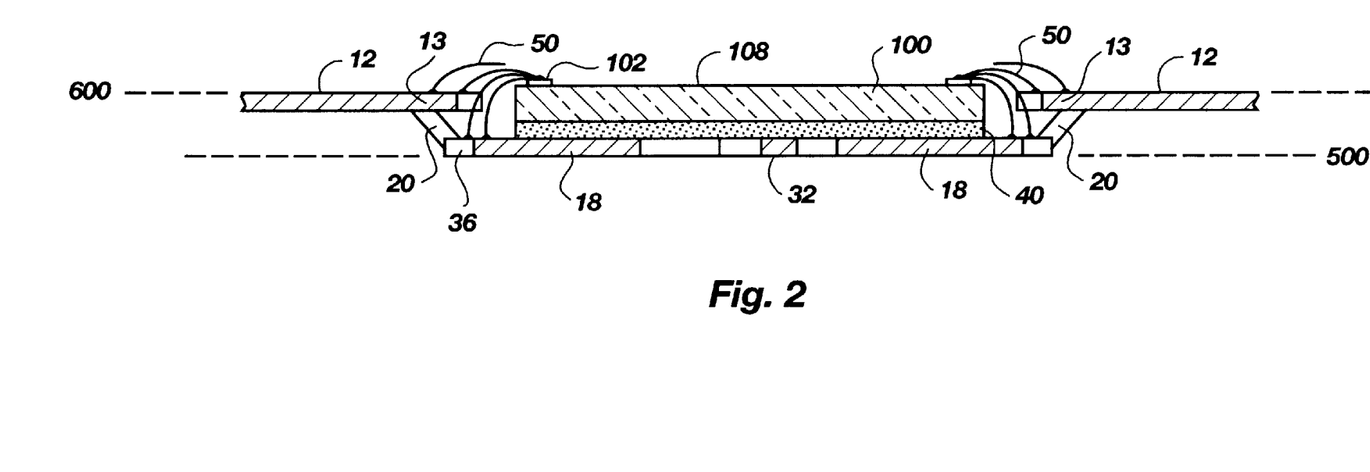
FIG. 2 is a cross sectional view taken along line A—A of FIG. 1 of a portion of the semiconductor assembly of the first embodiment of the present invention.

Referring to drawing FIG. 2, the semiconductor device 100 is adhesively attached to tape 40 which is, in turn, adhesively attached using a suitable thermosetting adhesive to the die paddle supports 32 and portions 24 of the second plurality of lead fingers 18. As illustrated, the ends 13 of the first lead fingers 12 and ends 36 of the second lead fingers 18 are connected to the bond pads 102 of the active surface 108 of the semiconductor device 100 by wire bonds 50.

Since the first plurality of lead fingers 12 are located in substantially the same horizontal plane 600 as the active surface 108 of the semiconductor device 100 having bond pads 102 thereon and the second plurality of lead fingers 18 are located in substantially the same horizontal plane 500 below the inactive bottom surface of the semiconductor device 100, a large number of lead fingers 12 and 18 may be used to form connections between the bond pads 102 and first plurality of lead fingers 12 and second plurality of lead fingers 18 because the lead fingers 12 and 18 are located in different horizontal planes with respect to the semiconductor device 100. Furthermore, second plurality of lead fingers 18 may be used to support the semiconductor device 100 in the package 200 and may be used to conduct heat away from the semiconductor device 200 during operation. In this manner, greater flexibility is created in the design of the circuitry of the semiconductor device 100 and the location of the bond pads 102 thereon. Additionally, since the lead frame 10 of the present invention has the location of the first plurality of lead fingers 12 adjacent the peripheral sides 104 of the semiconductor device 100 in substantially the same horizontal plane as the active surface 108 of the semiconductor device 100 while the second plurality of lead fingers 18 are located in substantially the same horizontal plane as the die paddle members 30 supporting the semiconductor device 100, the assembly of the semiconductor device 100 and lead frame 10 of the present invention may be wire bonded in conventional wire bonding equipment and encapsulated in conventional die molding equipment without substantial modification thereof. In this manner, the present invention of the lead frame 10 and semiconductor device 100 saves the expenditure of capital investment in new wire bonding and die molding equipment.

Figure 3:
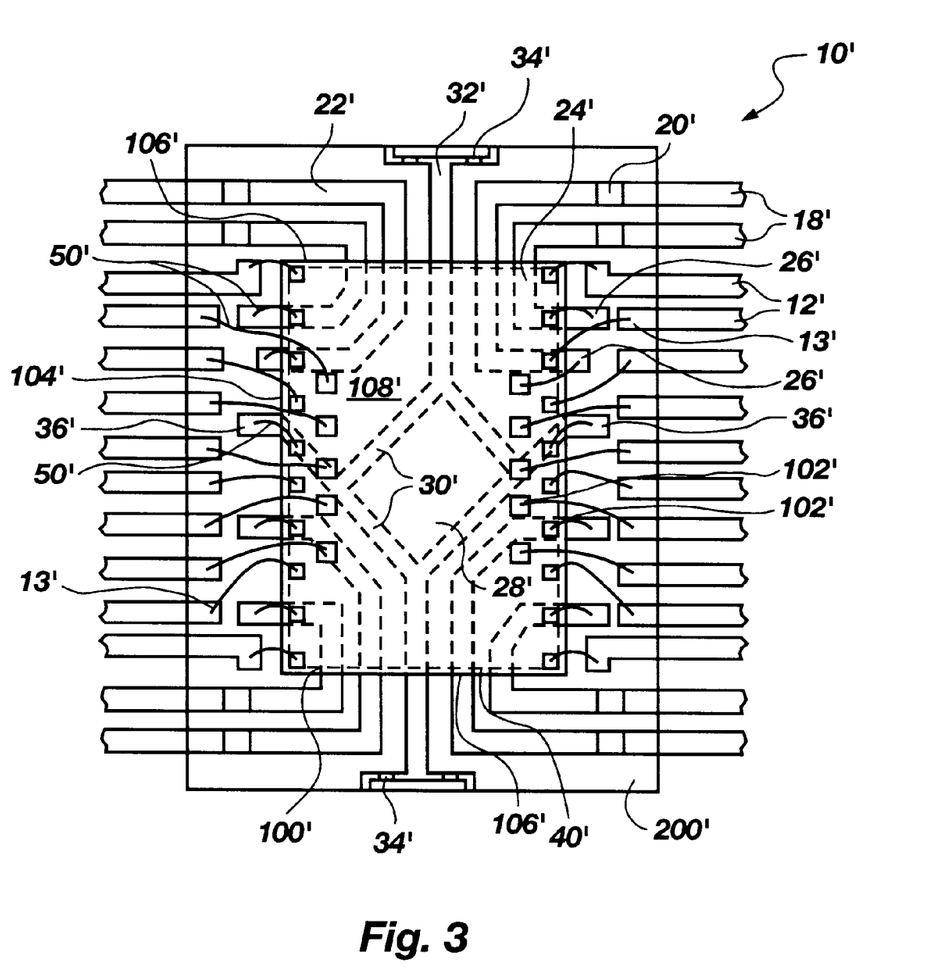
FIG. 3 is a top view of a second embodiment of the present invention of the semiconductor assembly including a semiconductor device and lead frame.

Referring to drawing FIG. 3, a semiconductor assembly of a second embodiment of the present invention including a portion of the lead frame 10' is shown in relation to a semiconductor device 100' in an encapsulated package 200'.

As illustrated, the semiconductor chip 100' includes a plurality of bond pads 102' located in multiple rows or columns on the longer peripheral sides 104' thereon, rather than on the ends 106' of the semiconductor device 100'. The semiconductor device 100' may of any type, such as a memory device, a microprocessor, etc.

The lead frame 10' of the present invention is illustrated having a first plurality of lead fingers 12' extending substantially inwardly terminating at ends 13' thereof which are located substantially adjacent the longer peripheral sides 104' of the semiconductor device 100' in substantially the same horizontal plane as the active surface 108' of the semiconductor device 100'.

As further illustrated, the lead frame 10' of the present invention further includes a second plurality of lead fingers 18' which extend substantially inwardly, are downset at portions 20' thereon to have portions 22' thereof lying a horizontal plane which is substantially slightly lower than the inactive bottom surface of the semiconductor device 100', the portions 22' of the lead fingers 18' extending to the ends 106' of the semiconductor device 100', and lead finger portions 24' which extend under the semiconductor device 100', which help support the semiconductor device 100', and terminate at ends 26' outside the semiconductor device 100' substantially adjacent a longer peripheral side 104' of the semiconductor device 100'.

The lead frame 10' of the present invention further includes die paddle 28' formed by die paddle members 30' in any desired geometric shape or as a solid one piece member which are, in turn, connected to die paddle supports 32', each of which contain downsets 34' therein so that the die paddle 28' is substantially located in a horizontal plane below the inactive bottom surface of the semiconductor device 100'. The die paddle supports 32' each further include ends 36' thereon which terminate outside the semiconductor device 100' substantially adjacent a longer peripheral side 104' of the semiconductor device 100'.

The first plurality of lead fingers 12', second plurality of lead fingers 18', and die paddle supports 32' have the ends 13', 26', and 36' thereof, respectively, connected to bond pads 102' of the semiconductor device 100' by means of wire bonds 50' formed during suitable wire bond processes well known in the art.

As illustrated, after the wire bonds 50' are made connecting the ends 13', 26', and 36' of the first plurality of lead fingers 12', second plurality of lead fingers 18', and die paddle supports 32', respectively, the semiconductor device 100' is encapsulated in suitable well known epoxy plastic material to form the package 200' in a well known standard transfer die molding process.

As illustrated, a piece of suitable tape 40', such as Kapton tape, is adhesively secured, using any suitable thermosetting adhesive, to the portions 24' of the first plurality of lead fingers 18', the die paddle members 30', and die paddle supports 32', Preferably, a silver filled epoxy paste adhesive material is used to adhesively attach the semiconductor device 100' to the tape 40'.

The second plurality of lead fingers 18' may be used to support the semiconductor device 100' in the package 200' and may be used to conduct heat away from the semiconductor device 200' during operation. In this manner, greater flexibility is created in the design of the circuitry of the semiconductor device 100' and the location of the bond pads 102' thereon. Additionally, since the lead frame 10' of the present invention has the location of the first plurality of lead fingers 12' adjacent the peripheral sides 104' of the semiconductor device 100' in substantially the same horizontal plane as the active surface 108' of the semiconductor device 100' while the second plurality of lead fingers 18' are located in substantially the same horizontal plane as the die paddle members 30' supporting the semiconductor device 100', the assembly of the semiconductor device 100' and lead frame 10' of the present invention may be wire bonded in conventional wire bonding equipment and encapsulated in conventional die molding equipment without substantial modification thereof. In this manner, the present invention of the lead frame 10' and semiconductor device 100' saves the expenditure of capital investment in new wire bonding and die molding equipment.

Figure 4:
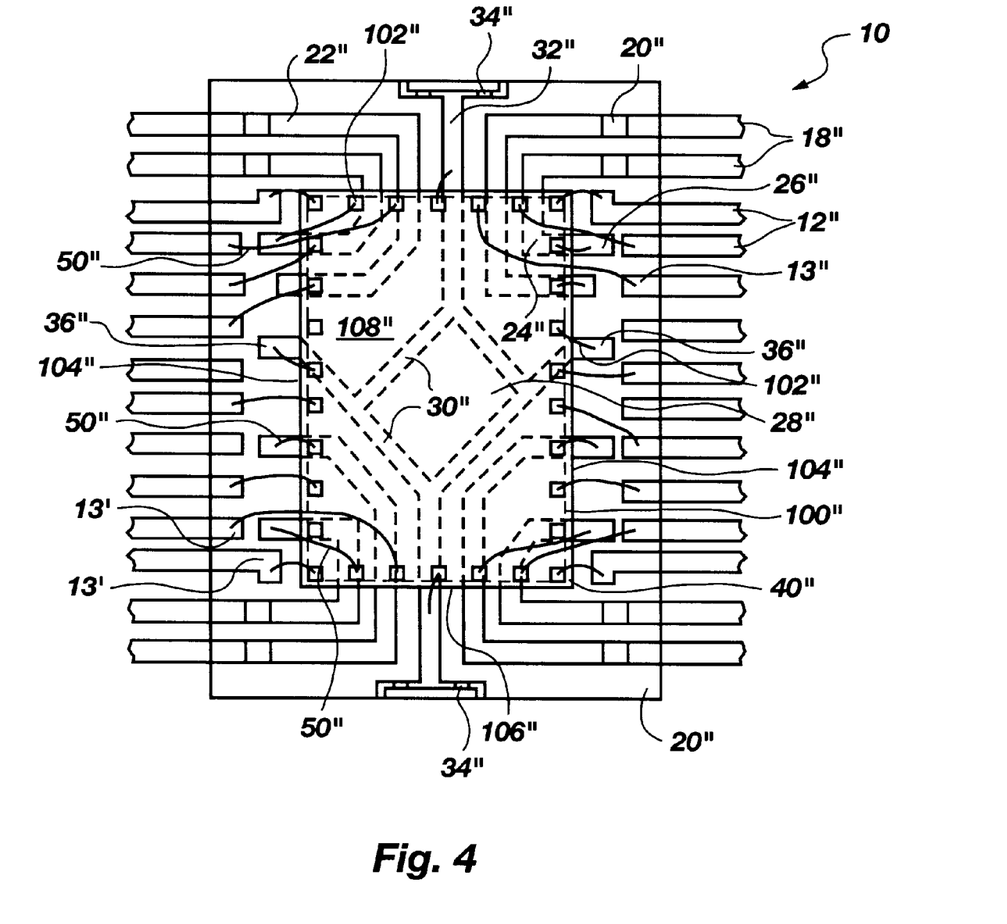
FIG. 4 is a top view of a third embodiment of the present invention of the semiconductor assembly including a semiconductor device and lead frame.

Referring to drawing FIG. 4, a semiconductor assembly of a third embodiment of the present invention including a portion of the lead frame 10" is shown in relation to a semiconductor device 100" in an encapsulated package 200". As illustrated, the semiconductor chip 100" includes a plurality of bond pads 102" located on the longer peripheral sides 104" and the ends 106" thereon. The semiconductor device 100" may of any type, such as a memory device, a microprocessor, etc.

The lead frame 10" of the present invention is illustrated having a first plurality of lead fingers 12" extending substantially inwardly terminating at ends 13" thereof which are located substantially adjacent the longer peripheral sides 104" of the semiconductor device 100" in substantially the same horizontal plane as the active surface 108" of the semiconductor device 100".

As further illustrated, the lead frame 10" of the present invention further includes a second plurality of lead fingers 18" which extend substantially inwardly, are downset at portions 20" thereon to have portions 22" thereof lying a horizontal plane which is substantially slightly lower than the inactive bottom surface of the semiconductor device 100", the portions 22" of the lead fingers 18" extending to the ends 106" of the semiconductor device 100', and lead finger portions 24" which extend under the semiconductor device 100", which help support the semiconductor device 100", and terminate at ends 26" outside the semiconductor device 100" substantially adjacent a longer peripheral side 104" of the semiconductor device 100".

The lead frame 10" of the present invention further includes die paddle 28" formed by die paddle members 30" in any desired geometric shape or as a solid one piece member which are, in turn, connected to die paddle supports 32", each of which contain downsets 34" therein so that the die paddle 28" is substantially located in a horizontal plane below the inactive bottom surface of the semiconductor device 100". The die paddle supports 32" each further include ends 36" thereon which terminate outside the semiconductor device 100" substantially adjacent a longer peripheral side 104" of the semiconductor device 100".

The first plurality of lead fingers 12", second plurality of lead fingers 18", and die paddle supports 32" have the ends 13", 26", and 36" thereof, respectively, connected to bond pads 102" of the semiconductor device 100" by means of wire bonds 50" formed during suitable wire bond processes well known in the art.

As illustrated, after the wire bonds 50" are made connecting the ends 13", 26", and 36" of the first plurality of lead fingers 12", second plurality of lead fingers 18", and die paddle supports 32", respectively, the semiconductor device 100" is encapsulated in suitable well known epoxy plastic material to form the package 200" in a well known standard transfer die molding process.

As illustrated, a piece of suitable tape 40", such as Kapton tape, is adhesively secured, using any suitable thermosetting adhesive, to the portions 24" of the first plurality of lead fingers 18", the die paddle members 30", and die paddle supports 32". Preferably, a silver filled epoxy paste adhesive material is used to adhesively attach the semiconductor device 100" to the tape 40".

Also, bond pads 102" are located on the ends 106" semiconductor device 100 and be interconnected with the second plurality of lead fingers 18" or the die paddle supports 36", if desired. In this manner, greater flexibility is created in the design of the circuitry of the semiconductor device 100" and the location of the bond pads 102 thereon. Additionally, since the lead frame 10" of the present invention has the location of the first plurality of lead fingers 12" adjacent the peripheral sides 104" of the semiconductor device 100" in substantially the same horizontal plane as the active surface 108" of the semiconductor device 100" while the second plurality of lead fingers 18" are located in substantially the same horizontal plane as the die paddle members 30" supporting the semiconductor device 100", the assembly of the semiconductor device 100" and lead frame 10" of the present invention may be wire bonded in conventional wire bonding equipment and encapsulated in conventional die molding equipment without substantial modification thereof. In this manner, the present invention of the lead frame 10" and semiconductor device 100" saves the expenditure of capital investment in new wire bonding and die molding equipment.

As is readily apparent from the foregoing, the semiconductor assembly of the present invention including a semiconductor device and lead frame having a portion of the lead fingers supporting the semiconductor device offers the advantages of having a portion of the lead fingers supporting the semiconductor device thereby allowing a smaller die paddle to be used and a less substantial die paddle be required, a wide variety of sizes of semiconductor devices may be used with the lead frame, a wide variety of bond pad layouts may be used on the semiconductor devices with the same lead frame, conventional wire bonding equipment may be used to form the connections between the bond pads on the semiconductor device and the lead frame, conventional transfer molding equipment may be used to encapsulate the assembly, and a higher lead finger density may be used in the same available area depending upon lead frame and semiconductor device design.

It is contemplated that changes, additions modifications, and deletions may be may to the semiconductor assembly of the present invention which fall within the scope of the claimed invention. For instance, although the semiconductor device of the present invention is illustrated with longer peripheral sides and opposed ends, the semiconductor device may be substantially square in configuration thereby having opposed peripheral sides and opposed ends of substantially the same length. The lead frame may be formed with any number of lead fingers as space allows. Any number of lead fingers may be used to support the semiconductor device and addition to/or without a die paddle support of the semiconductor device. The ends of the lead fingers extending along the peripheral sides of the semiconductor device may extend past the ends of adjacent lead fingers. The lead fingers extending below the semiconductor device may be spaced any desired distance below the bottom inactive surface of the semiconductor device.

What is claimed is:

1. A method of making a lead frame for a semiconductor assembly having a semiconductor device having opposed longer peripheral sides, opposed ends, an active surface in substantially first horizontal plane, and inactive bottom surface substantially a second horizontal plane, and a plurality of bonds pads located on the active surface of the semiconductor device, a first portion of the plurality of bond pads located adjacent one of the opposed longer peripheral sides and a second portion of the plurality of bond pads located adjacent the another of the opposed longer peripheral sides, said method comprising the steps of:

forming a first plurality of lead fingers extending substantially in the first horizontal plane of the active surface of the semiconductor device, each lead finger of the first plurality of lead fingers terminating in an end located adjacent a longer peripheral side of the opposed longer peripheral sides of the semiconductor device; and forming a second plurality of lead fingers extending below the bottom inactive surface of the semiconductor device, each lead finger of the second plurality of lead fingers having a portion thereof extending adjacent an end of the opposed ends of the semiconductor device and terminating in an end located adjacent a longer peripheral side of the longer opposed peripheral sides of the semiconductor device.

2. The method of claim 1, wherein said method further includes:

forming a die paddle.

3. The method of claim 1, wherein the ends of the first plurality of lead fingers extend past the ends of adjacent lead fingers of the second plurality of lead fingers.

4. The method claim 1, wherein the ends of the second plurality of lead fingers extend past the ends of adjacent lead fingers of the first plurality of lead fingers.

5. The method claim 1, further including the step of:
placing tape on the second plurality of lead fingers.

6. The method 2, further including the step of: placing tape between the die paddle and the bottom inactive surface of the semiconductor device.

7. The method of claim 2, further including the step of:
placing tape between the die paddle and the second plurality of lead fingers and the bottom inactive surface of the semiconductor device.

8. The method of claim 5, further comprising the step of:
adhesively attaching the second plurality of lead fingers to the tape.

9. The method of claim 8, further comprising the step of:
adhesively attaching the second plurality of lead fingers to the tape using thermosetting adhesive.

10. The method claim 2, wherein the die paddle includes at least one portion thereon extending beyond a longer peripheral side of the opposed longer peripheral sides and at least another portion extending beyond an end of the opposed ends of the semiconductor device.

11. The method claim 1, wherein at least one lead fingers of the second plurality of lead fingers includes as offset therein.

12. The method claim 1, wherein the second plurality of lead fingers includes:

at least one lead finger having a portion thereof extending adjacent a portion of a lead finger of the first plurality of lead fingers, a portion thereof extending substantially adjacent an end of the opposed ends of the semiconductor device, a portion extending substantially opposed to an end of the opposed ends of the semiconductor device, and having a portion extending beyond a side of the opposed longer peripheral sides of the semiconductor device.

13. The method claim 2, wherein the second plurality of lead fingers includes:

at least one lead finger having a portion thereof extending adjacent a portion of a lead finger of the first plurality of lead fingers, a portion thereof extending substantially adjacent an end of the opposed ends of the semiconductor device, a portion extending substantially opposed to an end of the opposed ends of the semiconductor device and extending adjacent a portion of the die paddle, and having a portion extending beyond a side of the opposed longer peripheral sides of the semiconductor device.

\* \* \* \* \*

UNITED STATES PATENT AND TRADEMARK OFFICE
CERTIFICATE OF CORRECTION

PATENT NO : 5,907,769
DATED : May 25, 1999
INVENTOR(S) : David J. Corisis

It is certified that error appears in the above-identified patent and that said Letters Patent is hereby corrected as shown below:

column 2, line 67, change "tipper" to --upper--.

Signed and Sealed this

Twenty-first Day of December, 1999

Attest:

Q. TODD DICKINSON

Attesting Officer

Acting Commissioner of Patents and Trademarks